Figure 2:
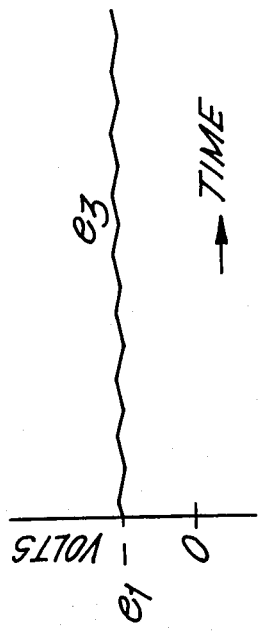

United States Patent [19]

Brook

[11] 4,224,573

[45] Sep. 23, 1980

[54] ELECTRIC CIRCUIT DEVICE AND PENDULUM UNIT INCORPORATING SUCH DEVICES

[75] Inventor: David L. Brook, Watford, England

[73] Assignee: S. G. Brown Limited, Watford, England, by said David L. Brook; part interest

[21] Appl. No.: 930,203

[22] Filed: Aug. 2, 1978

[30] Foreign Application Priority Data

Aug. 5, 1977 [GB] United Kingdom ............... 32981/77

[51] Int. Cl.$^3$ .......................... G01C 9/06; G01C 9/12
[52] U.S. Cl. ......................................... 328/1; 328/127; 328/138; 328/146; 73/505; 33/308; 33/312; 33/366
[58] Field of Search ............... 328/146, 147, 127, 138; 73/505, 517 R; 33/312

[56] References Cited

U.S. PATENT DOCUMENTS

| | | | |
|---|---|---|---|
| 2,819,052 | 1/1958 | Dudenhausen | 73/517 R |
| 3,494,204 | 2/1970 | Whitehead | 73/517 R |
| 3,845,569 | 11/1974 | Otte et al. | 33/312 |
| 3,986,127 | 10/1976 | Ray | 328/127 X |
| 4,035,734 | 7/1977 | Flormann et al. | 328/127 X |
| 4,072,866 | 2/1978 | Kabat | 328/127 X |

Primary Examiner—John S. Heyman
Attorney, Agent, or Firm—Young & Thompson

[57] ABSTRACT

An electrical circuit device comprises an integrating amplifier arrangement that provides a circuit output signal in response to an input signal from a differential amplifier. The differential amplifier receives at one of its input terminals the circuit input signal and at its other input terminal the circuit output signal. The circuit limits its output signal to change at less than a predetermined rate, and the device is particularly useful in a pendulum unit of a gyroscompass, where the rate limitation can be arranged such that the compass does not respond to acceleration due to motion of the craft or vehicle in which the compass is mounted.

6 Claims, 5 Drawing Figures

ELECTRIC CIRCUIT DEVICE AND PENDULUM UNIT INCORPORATING SUCH DEVICES

The invention relates to an electric circuit device having a variety of applications.

According to the invention there is provided an electric circuit device comprising an integrator portion and a comparator portion, wherein the integrator portion is arranged to provide an output of the circuit from an intermediate input derived from the comparator portion, and wherein the comparator portion is arranged to receive both an input of the circuit and the said output of the circuit.

The circuit output changes at a rate determined by circuit parameters which can be predetermined or selectively variable if required.

The electric circuit device of the invention can be used for many purposes for example as a discriminator or FM demodulator or as a rate limiting device. As a rate limiting device, this circuit can be used, for example, for reducing the sensitivity of a pendulum signal to imposed accelerations.

The invention thus also provides a pendulum unit a pick-off member associated with the pendulum and arranged to provide a signal dependent on the tilt of the unit, and an electrical circuit arranged to receive said pick-off signal and to provide an output signal that is representative of only those changes in the pendulum output which are below a predetermined rate.

The pendulum unit can be associated with a gyro compass and the predetermined rate selected to permit the circuit output to follow changes in the pendulum output which occur at a rate which can be expected to occur in normal operation, but to prevent it from following changes at a greater rate as may occur because of accelerations of a vehicle in which the gyrocompass is mounted, due for example to a ship's change in course or its rolling about an axis between the North-South and East-West axes. A further improvement can be obtained by imposing a suitable limit on the pendulum pick-off output.

Figure 1:
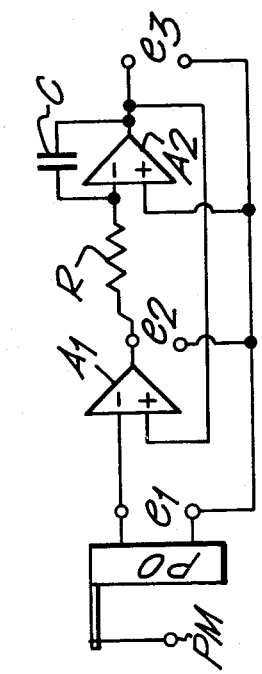

The invention will be further explained below with reference to the accompanying drawings in which:

FIG. 1 schematically shows a circuit device in accordance with the invention, and each of FIGS. 2 to 9 shows the output of the circuit due to a respective input.

The circuit device of the invention illustrated in FIG. 1 comprises a first amplifier $A_1$, having two input terminals one of which constitutes the input terminal of the device. The output terminal of the amplifier $A_1$ is connected through a resistor R to the input terminal of a second amplifier $A_2$. A capacitor C is connected across the amplifier $A_2$ the output terminal of which constitutes the output of the device. The output of the amplifier $A_2$ is connected to the other input terminal of the amplifier $A_1$.

If a voltage $e_1$ is applied to the input terminal of the device, the amplifier $A_1$ supplies an output $e_2$ to the amplifier $A_2$ which acts as an integrator because of capacitor C. As the output of the amplifier $A_2$ is fed back to the amplifier $A_1$, this functions as a comparator.

The output $e_2$ of the amplifier $A_1$ switches between $+E$ and $-E$, where E is a constant and the sign of E is dependent upon the sign of ($e_1 - e_3$). The amplifier $A_1$ can have a high gain and a rapid response so that hysteresis and time delay are extremely small. As the amplifier $A_2$ acts as an integrator, $$e_3 = \frac{1}{RC} \int e_2 \, dt + \text{(a constant)}$$

Thus, where D is the Heaviside operator, $$De_3 = \frac{+E}{RC} \text{ or } De_3 = \frac{-E}{RC}$$

depending upon the sign of ($e_1 - e_3$). Thus $e_3$ always changes at this rate; it cannot be steady, nor can it change at any other rate.

The behaviour of the illustrated circuit in response to simple voltage signals at the input is now described with reference to FIGS. 2 and 3.

FIG. 2 shows the output $e_3$ for a constant input $e_1$. The comparator portion of the circuit continuously switches up and down, charging and discharging the integrator portion, so that $e_3$ is a trapezoidal wave with a mean value equal to $e_1$.

Figure 3:
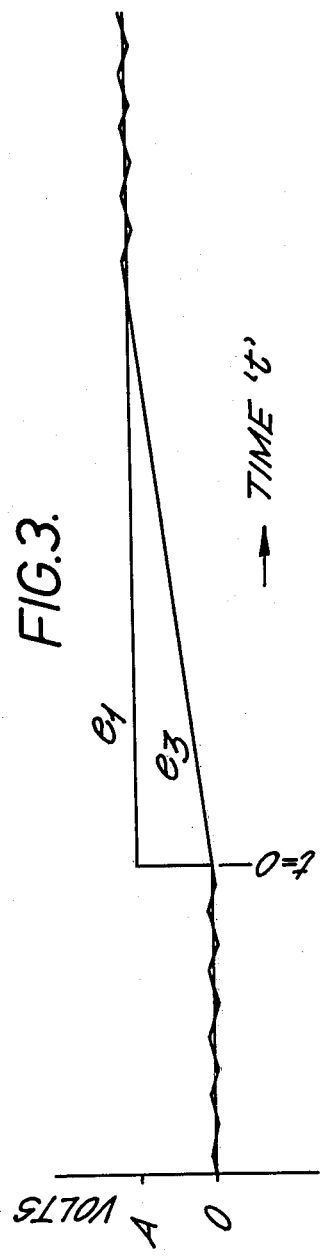

FIG. 3 shows a step change in $e_1$ at $t=0$. For a time before $t=0$, $e_1=0$, and $e_3$ has a mean value of zero. After $t=0$, $e_1=A$ volts and $e_3$ increases at a constant slope $$De_3 = \frac{E}{RC}$$

until $e_3=e_1$ and then $e_3$ remains with a mean value of A and the small trapezoidal excursions as before. In FIGS. 2 and 3 the amplitude of the trapezoidal wave has been exaggerated so that it can be shown at all; in practice the trapezoidal wave is vanishingly small.

The operation of the device as a rate limiting circuit device in association with a gyrocompass is described below with reference to FIGS. 1, 4 and 5. In this application, the input $e_1$ is supplied by a pick-off PO associated with the gyrocompass pendulum PM. The input $e_1$ is a voltage of which the sign and magnitude depend upon the gyro tilt angle according to the equation:

$$e_1 = \frac{K(\theta + a/g)}{1 + \tau D}$$

where K is a scaling constant,
 $\theta$ is the gyro tilt angle,
 $\tau$ is the pendulum time constant,
 a is the North-South acceleration, and
 g is the gravity acceleration constant.

Suppose the gyrocompass to be aboard a vehicle at rest with the compass settled, that is steady and ready for use, so that $\theta$ is zero and $e_1$ is zero. Now let the vehicle be subjected to a North-South or South-North acceleration, or some component of such an acceleration due for example to a straight course speed change, or a turn at speed, or a combination of these.

Figure 4:
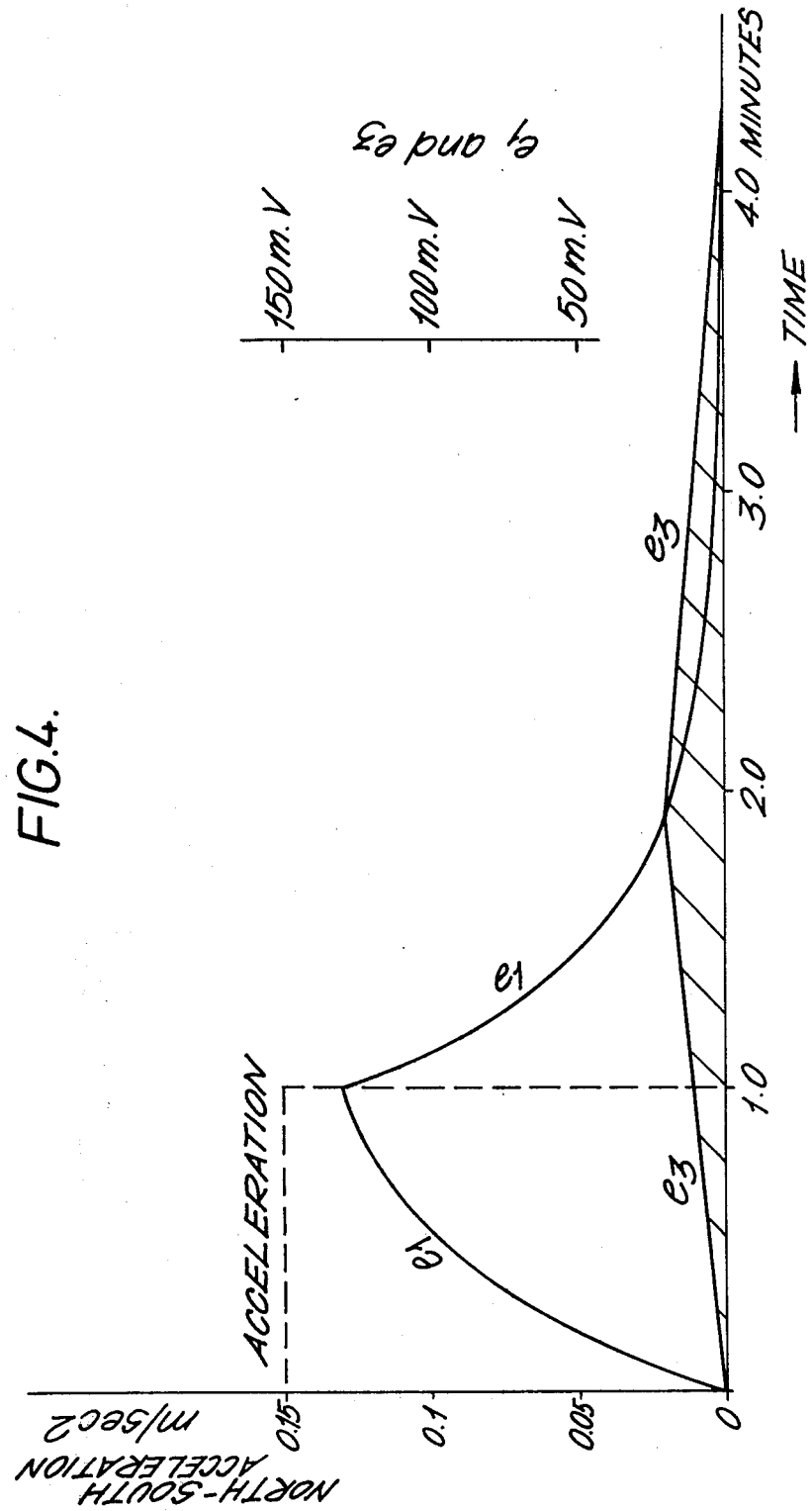
Figure 5:
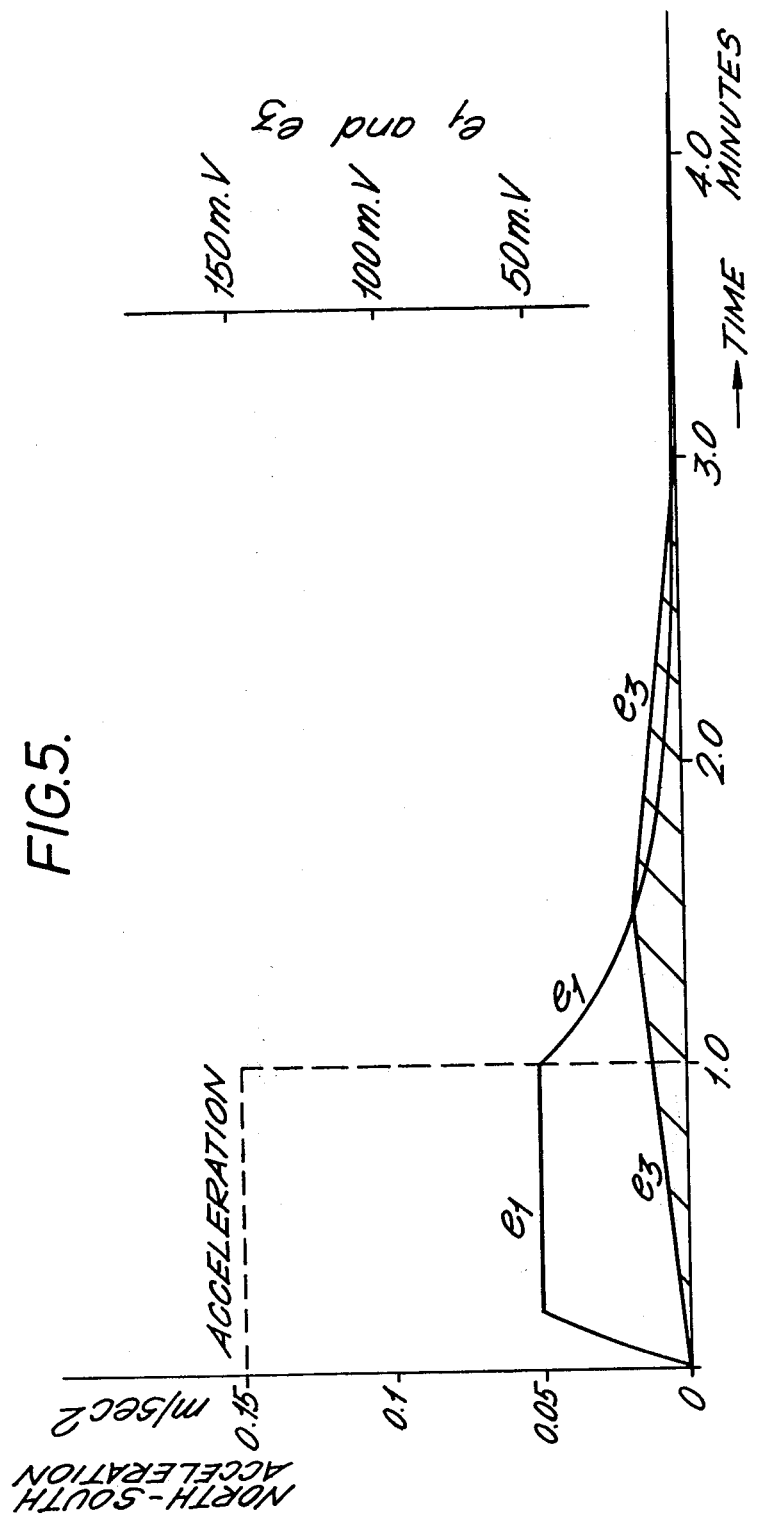
Figure 6:
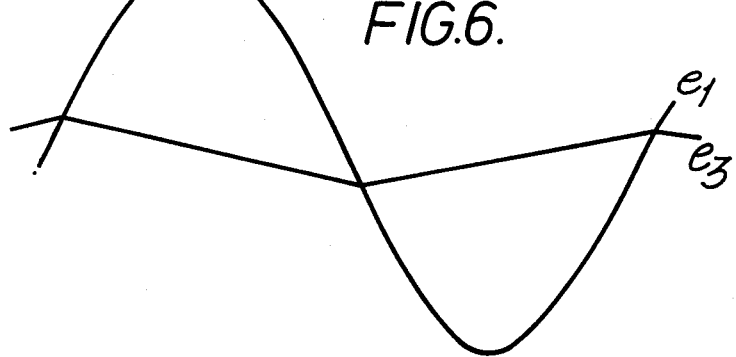
Figure 7:
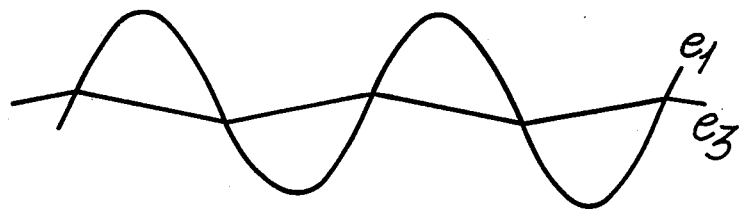
Figure 8:
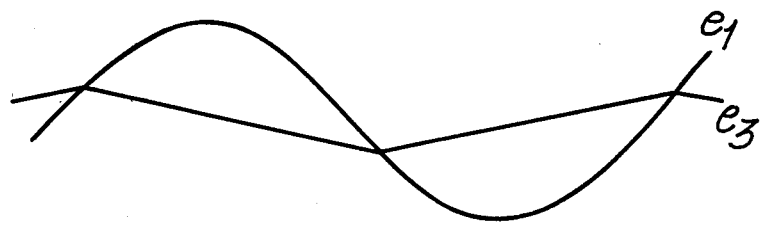

In FIG. 4, the acceleration is idealized as a step acceleration and suitable values are inserted by way of example. The step acceleration is shown as 'a'=0.15 meter/-sec$^2$ for one minute of time, equivalent to a North-South speed change of 17½ knots. The pendulum time constant is shown as ½ minute and $e_1$ and $e_3$ are scaled at $10^3$ m V per meter second$^{-2}$, which can also be written as 170 m V per degree of steady state pendulum tilt. This voltage scaling is purely arbitrary.

Commencing at $t=0$, $e_1$ increases exponentially towards the target 150 m V level whilst the acceleration lasts, and $e_3$ increases at a constant rate. At $t=1$ minute, the acceleration ceases and now $e_3$ falls exponentially towards zero. At $t=1.9$ minutes, $e_3$ exceeds $e_1$ and $e_3$ then begins to fall at the same constant rate. In this example the slope of $e_3$ has been chosen as 11 mV per minute of time; $e_3$ and $e_1$ have the same steady state scaling and a continuous change of $e_1$ at this rate (11.0 m V per minute) would be produced by a pendulum continuously tilting at a rate of 4 degrees per hour. Thus from $t=1.9$ minutes, $e_3$ falls at the constant rate until $e_1$ exceeds $e_3$ again at $t=4.2$ minutes, and from this point onwards $e_3$ tracks $e_1$ as $e_1$ tends to zero. The shaded area beneath the $e_3$ line is proportional to a North-South speed change of about 5 knots, which is to be compared with the original acceleration envelope of 17½ knots.

The circuit is more effective if a smaller value is chosen for the slope of the $e_3$ line, but a sufficient rate must of course be chosen to allow the compass to operate properly.

Essentially, the voltage $e_3$ is allowed to change rapidly enough to follow changes in $e_1$ due to normal gyro compass operation, but it is not allowed to change rapidly enough to follow greater rates of change of $e_1$ which arise from vehicle acceleration. If the pendulum is fitted with stops or electrical means of limited $e_1$, the performance can be further improved. FIG. 5 shows the case where $e_1$ has been so limited to 50 m V. The acceleration input is as before, so is the scaling and the pendulum time constant and the slope of $e_3$. This time, the area under $e_3$ is porportional to a speed change of 3 knots.

The rate limiting circuit of the invention can also be applied to reduction of the type of gyrocompass error commonly known as "intercardinal rolling error". In one design of gyrocompass with pendulum control, in which the gyroscope is pivoted to swing about the nominal North-South horizontal axis and is made bottom heavy, this error is caused by swinging of the gryoscope so pivoted combined with swinging of the pendulum about a nominal East-West horizontal axis. Such combined swinging commonly occurs when such a gyrocompass is used aboard a ship. If the gyrocompass is sited above the roll centre of the ship—as it normally is—then there will be cyclic horizontal accelerations caused by the rolling of the ship, and if it rolls about an axis which is not exactly North-South nor exactly East-West, but "intercardinal", then such acceleration will cause the combined swinging in question which can lead to an error in the gyrocompass. This error is approximately proportional to the product of the two swing amplitudes. If the pendulum output signal is processed through a circuit in accordance with the invention, the swing amplitude of the signal is greatly reduced and so is this particular error. The operation of the circuit of the invention in this context will be further understood from FIGS. 6, 7 and 8 which show the outputs $e_3$ of the circuit for respective sinusoidal inputs $e_1$, the maximum rate of change of $e_1$ being considerably greater than the constant rate chosen for $e_3$ in each case. From these three figures it can be seen how the circuit processes such sinusoidal inputs, and that:

(i) The output is a trapezoidal wave at the same frequency as the input.

(ii) The output amplitude is almost independent of the input amplitude.

(iii) The output amplitude is approximately inversely proportional to the input frequency.

Figure 9:
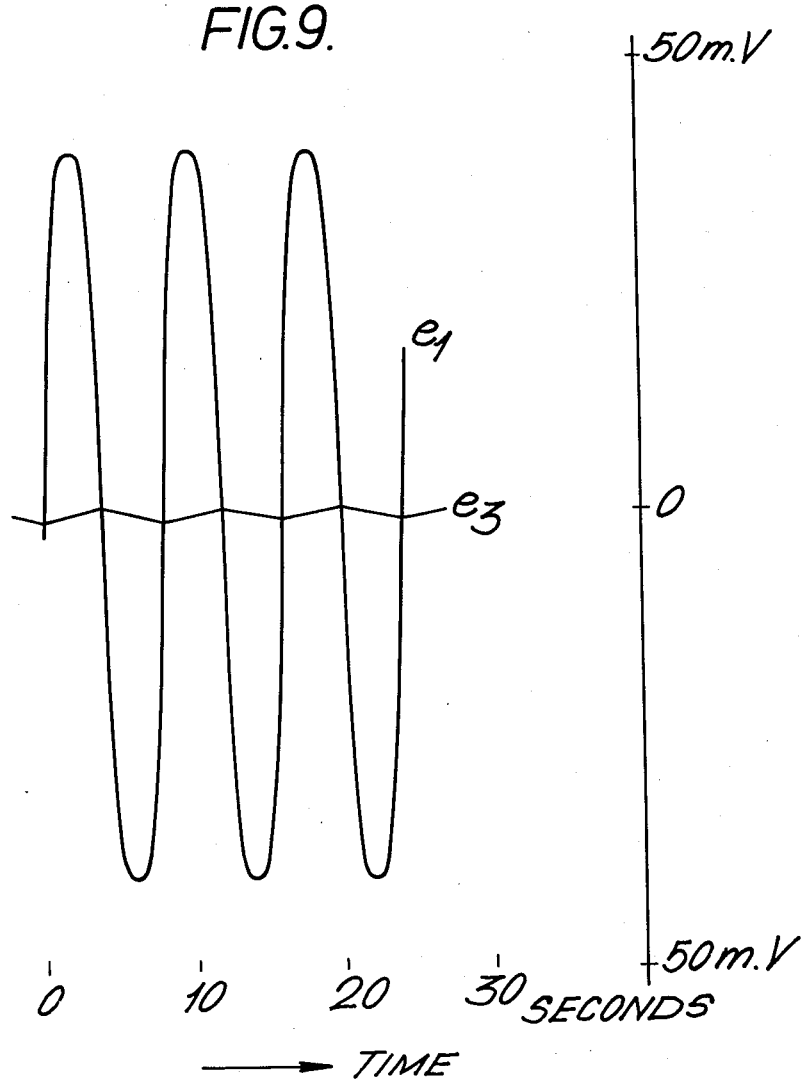

In practice the rate of change of $e_3$ is chosen to ensure that the circuit greatly attenuates such rolling signal inputs. FIG. 9 resembles FIGS. 6, 7 and 8 but shows possible values by way of example. Both the m V scale and time scale are three times greater than those used for FIGS. 4 and 5. The slope of $e_3$ therefore remains as before, also the pendulum time constant is as before. The input signal $e_1$ has an amplitude and a frequency which could easily come from such a pendulum on a ship which is rolling. The output wave form $e_3$ then follows from the action of the circuit upon this input signal $e_1$.

The rate limiting circuit of the invention can also be employed in a gyro vertical. In one type of gyro vertical, with pendulum control, there are two pendulums to measure tilt about respective mutually perpendicular horizontal axes, and if the gyro vertical is mounted on a vehicle then both pendulums will be influenced by horizontal acceleration of that vehicle. The circuit of the invention can be used, one such circuit for each pendulum, to attenuate the effects of the acceleration, just as described for a gyrocompass.

The invention will thus be seen to provide a simple circuit device capable of many uses and particularly but not exclusively of improving the performance of a gyrocompass in respect of its sensitivity to acceleration.

The circuit may be provided at least partially by digital components instead of the analogue components hereinbefore described.

I claim:

1. In combination, pendulum means, pick-off means associated with said pendulum means and adapted to provide an electrical output signal dependent on displacement of said pendulum means in response to influences external to said unit, and electric circuit means connected to said pick-off means to receive said pick-off means output signal, said circuit means being adapted to provide an output signal representing only such changes in said pick-off means output signal as are below a predetermined rate.

2. The combination of claim 1 wherein said electric circuit means comprises integrator means and comparator means, said integrator means providing said circuit means output signal, and said comparator means receiving said circuit means output signal and said pick-off means output signal.

3. The combination of claim 2 wherein said integrator means comprises amplifier means and capacitor means connected in feedback relationship thereto, and wherein said comparator comprises differential amplifier means.

4. The combination of claim 1 wherein said pendulum means further comprises stop means operative to limit said displacement of said pendulum means.

5. The combination of claim 2 wherein said circuit means further comprises signal limiting means operative between said pick-off means and said comparator means.

6. A gyrocompass with pendulum control means, wherein said pendulum control means comprises the combination of claim 1.

* * * * *